United States Patent
Sakai et al.

(10) Patent No.: US 6,444,543 B2
(45) Date of Patent: Sep. 3, 2002

(54) SEMICONDUCTOR SENSOR DEVICE AND METHOD OF MANUFACTURING THE SAME

(75) Inventors: Minekazu Sakai, Kariya; Hiroshige Sugito, Nagoya; Hiroshi Muto, Nagoya; Motoki Ito, Nagoya; Tsuyoshi Fukada, Aichi-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/866,709

(22) Filed: May 30, 2001

(30) Foreign Application Priority Data

Jun. 27, 2000 (JP) .......................... 2000-193150

(51) Int. Cl.⁷ ............................................ H01L 21/301
(52) U.S. Cl. .................... 438/460; 438/462; 438/464; 438/465; 257/790; 257/792
(58) Field of Search ................................ 438/113, 114, 438/122, 460, 462, 464, 465; 257/712, 790, 792

(56) References Cited

U.S. PATENT DOCUMENTS

| 5,362,681 A | 11/1994 | Roberts, Jr. et al. |
| 5,435,876 A | 7/1995 | Alfaro et al. |
| 5,998,238 A | * 12/1999 | Kosaki .................... 438/114 |
| 6,255,741 B1 | * 7/2001 | Yoshihara et al. ........... 257/792 |

FOREIGN PATENT DOCUMENTS

| DE | 19954022 | 5/2000 |
| JP | 8-32090 | 2/1996 |

OTHER PUBLICATIONS

U.S. application No. 09/306,381, Muto et al., filed May 8, 1998.

* cited by examiner

Primary Examiner—David Nelms
Assistant Examiner—Reneé R. Berry
(74) Attorney, Agent, or Firm—Law Offices of David G. Posz

(57) ABSTRACT

Plural semiconductor chips such as acceleration sensor chips formed on the first surface of a substrate are separated into individual pieces by dicing the substrate from the second surface thereof. A groove surrounding each sensor chip, along which the sensor chip is diced out, is formed at the same time the sensor chip is formed on the first surface. Before dicing, a protecting sheet covering the first surface is pasted along the sidewalls and the bottom wall of the groove. The groove is made sufficiently wide to ensure that the protecting sheet is bent along the walls of the groove without leaving a space between the groove and the protecting sheet. Thus, dicing dusts generated in the dicing process are prevented from being scattered and entering the sensor chip.

6 Claims, 8 Drawing Sheets

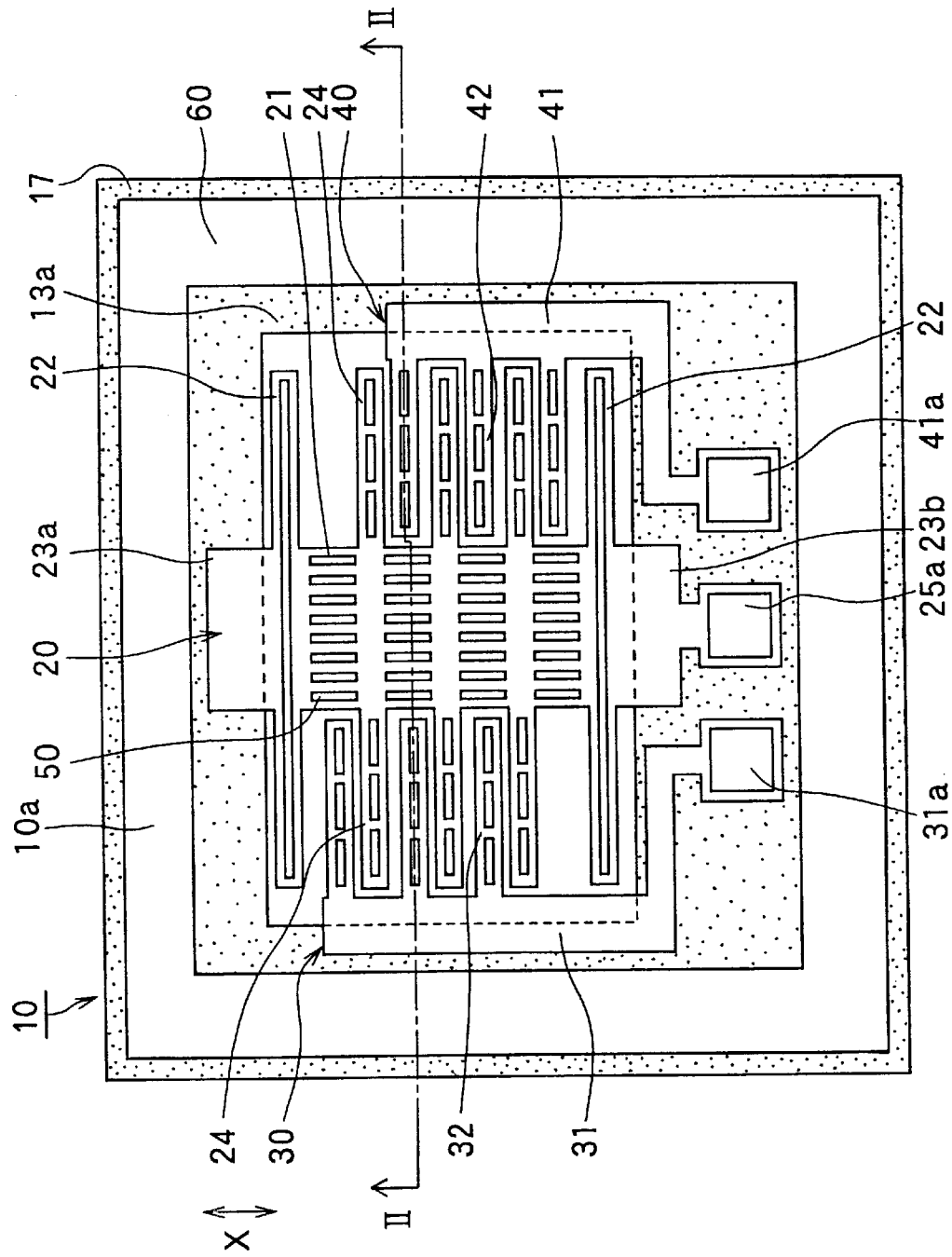

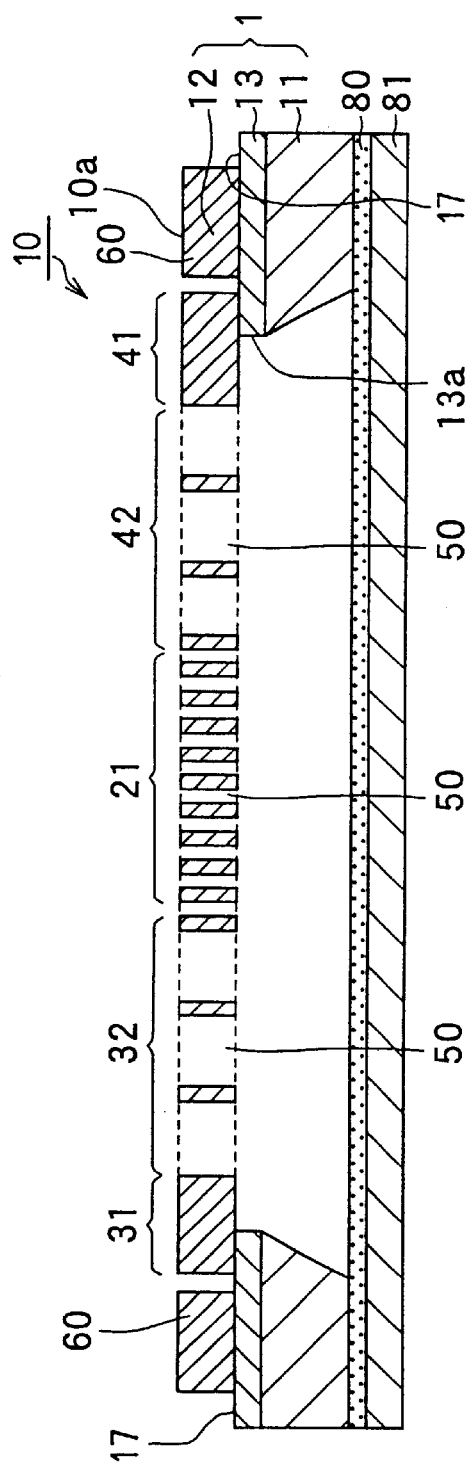
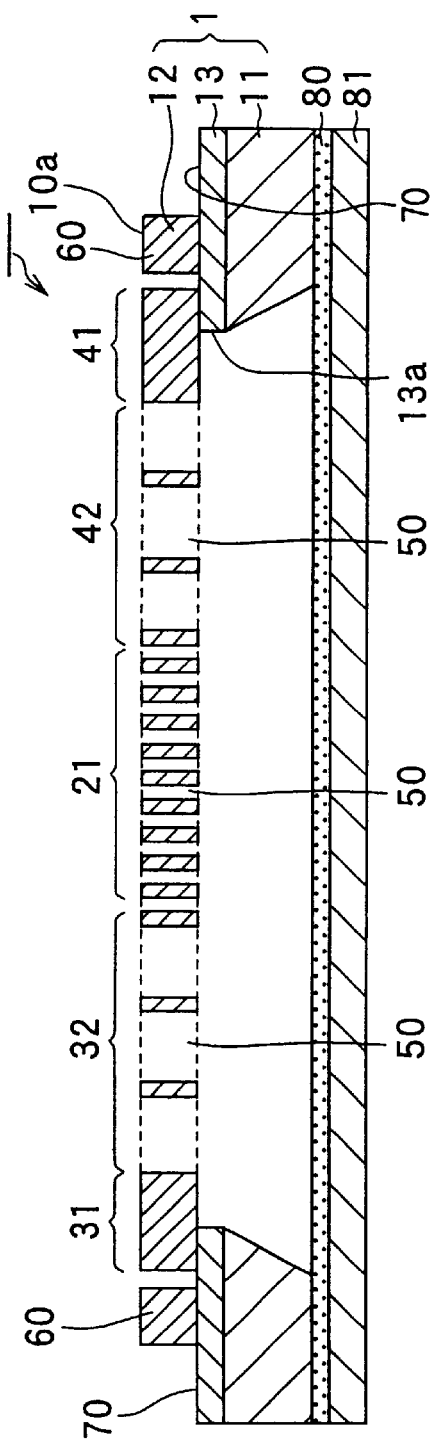

SEMICONDUCTOR SENSOR DEVICE AND METHOD OF MANUFACTURING THE SAME

CROSS-REFERENCE TO RELATED APPLICATION

This application is based upon and claims benefit of priority of Japanese Patent Application No. 2000-193150 filed on Jun. 27, 2000, the content of which is incorporated herein by reference.

BACKGROUND OF THE INVENTION

1. Field of the Invention

The present invention relates to a sensor device having a semiconductor chip diced out from a semiconductor substrate having plural chips formed thereon and to a manufacturing process of such a sensor device.

2. Description of Related Art

Semiconductor sensor chips manufactured by dicing a substrate having plural sensor chips formed thereon are known hitherto. The sensor chip includes stationary electrodes and movable electrodes facing the stationary electrodes. Both electrodes form a variable capacitance which varies according to a dynamic force such as an acceleration force imposed on the sensor chip. The sensor chip detects the dynamic force based on the capacitance of the sensor chip.

However, there has been a problem caused by dusts generated in the dicing process of the conventional sensor chips. That is, swarfs (dicing dusts) scattered in the dicing process enter into the sensor elements such as the movable electrodes. Such swarfs cause a malfunction in the sensor operation.

SUMMARY OF THE INVENTION

The present invention has been made in view of the above-mentioned problem, and an object of the present invention is to provide an improved sensor chip which is kept free from the dicing dusts. Another object of the present invention is to provide a manufacturing process in which the dicing dusts are prevented from entering into semiconductor sensor elements.

A protecting sheet is pasted on a first substrate surface on which plural sensor chips are formed, and then the substrate is diced from a second surface of the substrate thereby to separate the plural sensor chips into individual pieces. The sensor chip includes a beam structure composed of a pair of stationary electrode portions and a movable electrode portion. The beam structure forms a pair of capacitances which vary in accordance with a dynamic force such as an acceleration force imposed on the beam structure.

To prevent dicing dusts (swarfs) generated in the dicing process from being scattered and entering the sensor chip, a groove surrounding the sensor chip is formed on the first substrate surface. The width of the groove is made sufficiently wide so that the protecting sheet can be bent along the side walls and the bottom wall of the groove. The sensor chips are diced out from the substrate along the groove. Since no space in which the dicing dusts scatter is formed between the protecting sheet and the bottom wall of the groove, the sensor chip is kept free from the dicing dusts. Thus, the sensor malfunction otherwise caused by the dicing dusts is prevented.

Alternatively, a peripheral bank surrounding the groove may be further formed, and the dicing may be performed along the peripheral bank. In this case, the peripheral bank and the sensor portion inside the grooves are electrically connected. Since no space is formed between the protecting sheet and the peripheral bank, the dicing dusts are prevented from scattering.

According to the present invention, the dicing dusts do not scatter in the dicing process, and the sensor chip is kept free from the dicing dusts. Thus, the sensor malfunction due to the dicing dusts is avoided.

Other objects and features of the present invention will become more readily apparent from a better understanding of the preferred embodiments described below with reference to the following drawings.

BRIEF DESCRIPTION OF THE DRAWINGS

FIG. 1 is a plan view showing a semiconductor acceleration sensor chip made as a prototype sample;

FIG. 2 is a cross-sectional view showing the acceleration sensor chip shown in FIG. 1, taken along line II—II in FIG. 1;

FIG. 5 is a cross-sectional view showing the acceleration sensor chip shown in FIG. 4, taken along line V—V in FIG. 4;

Figure 3A:
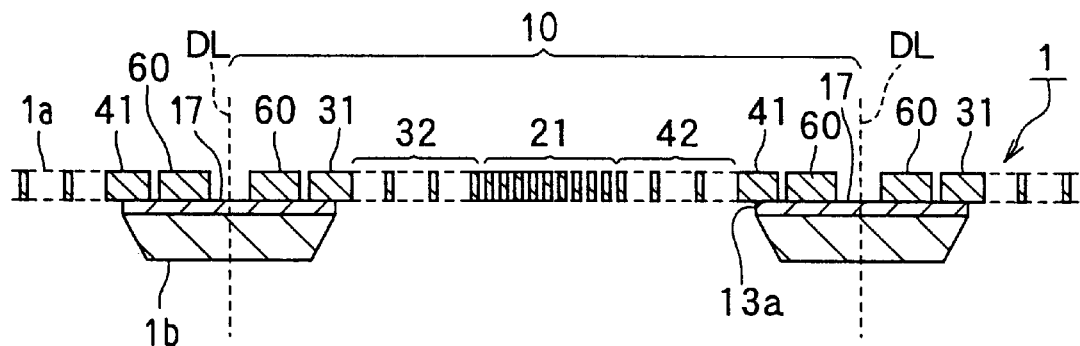
FIGS. 3A–3C are cross-sectional views showing a manufacturing process of the acceleration sensor chip shown in FIG. 1, FIG. 3C showing a partly enlarged cross-section.

DETAILED DESCRIPTION OF THE PREFERRED EMBODIMENTS (Prototype)

A prototype sample of a sensor device which was made before devising the preferred embodiments of the present invention will be described with reference to FIGS. 1–3C. The sensor chip 10 shown in FIG. 1 is a semiconductor sensor chip for measuring acceleration by means of capacitance changes. The sensor chip 10 is used as an acceleration sensor for controlling devices such as an air-bag, an ABS (an anti-block braking system), a VSC (a vehicle stability controller) mounted on an automobile vehicle. FIG. 1 shows a plan view of the sensor chip, FIG. 2 a cross-sectional view thereof taken along line II—II shown in FIG. 1, and FIGS. 3A–3C a process of manufacturing the sensor chip.

Plural sensor chips 10 formed on a semiconductor substrate are separated into individual chips by dicing the substrate. As shown in FIG. 2, the semiconductor substrate 1 is an SOI substrate composed of a first silicon layer 11, a second silicon layer 12 and an oxidized film 13 interposed between the first and second silicon layers 11, 12. The plural-sensor chips 10 are formed on the second silicon layer 12 by a known process. The top surface of the second silicon layer 12 is referred to as a first surface 10a of the sensor chip, and the bottom surface of the first silicon layer 11 is referred to as a second surface of the sensor chip. In FIG. 1, portions where the top surface of the oxidized film 13 is exposed are marked with dots to differentiate those portions from other portions.

A beam structure having a movable portion 20 and a pair of stationary portions 30, 40 is formed on the second silicon layer 12. The beam structure is referred to as a semiconductor element. A portion of the first silicon layer 11 and the oxidized film 13 corresponding to the beam structure is etched out to form an opening 13a. The movable portion 20 is composed of a pair of anchor portions 23a, 23b, a pair of beams 22, a weight 21 and movable electrodes 24 connected to the weight 21. The pair of anchor portions 23a, 23b are anchored on the oxidized film 13 supported on the first silicon layer 11 at the fringes of the opening 13a, so that the movable portion 20 is bridged across the opening 13a. In this manner, the beams 22 and the weight 21 having the movable electrodes 24 are positioned above and across the opening 13a.

Each beam 22 is shaped in an elongate frame and has a spring function resiliently movable in direction X shown in FIG. 1. More particularly, the beams 22 are displaced in the direction X when the weight 21 is accelerated in the direction X, and the beams 22 return to the original position when the acceleration in the direction X disappears. Thus, the movable electrodes 24 swing in the direction X according to the acceleration imposed on the weight 21 and the movable electrodes 24. The movable electrodes 24 connected to the weight 21 extend therefrom in a direction perpendicular to the direction X. In the embodiment shown in FIG. 1, three movable electrodes 24 extend to each side of the weight 21.

As shown in FIG. 1, a first stationary portion 30, and a second stationary portion 40 are supported on the fringes of the opening 13a, respectively, where the movable portion 20 are not anchored. That is, the first stationary portion 30 having three stationary electrodes 32 connected to a wiring portion 31 is positioned at the left side of the movable portion 20. The second stationary portion 40 having three stationary electrodes 42 connected to a wiring portion 41 is positioned at the right side of the movable portion 20. Both stationary portions 30, 40 are electrically insulated from each other. Both wiring portions 31, 41 are fixed on the oxidized film 13 supported on the first silicon layer 11, and each stationary electrode 32, 42 is positioned between the movable electrodes 24 with a certain space therebetween, thereby forming a comb-shaped electrode structure.

Each stationary electrode 32, 42 extending from the respective wiring portions 31, 41 has a rectangular cross-section. The stationary electrodes 32 positioned at the left side and the movable electrodes 24 form a first variable capacitor, and the stationary electrodes 42 positioned at the right side and the movable electrodes 24 form a second variable capacitor. A stationary electrode pad 31a is connected to the wiring portion 31, and another stationary electrode pad 41a is connected to the wiring portion 41. A movable electrode pad 25a is connected to the anchor portion 23b of the movable portion 20. Those electrode pads are made of aluminum or the like.

Plural through-holes 50 are formed in the weight 21, the movable electrodes 24 and the stationary electrodes 32, 42, respectively, as shown in FIGS. 1 and 2. The through-holes 50 serve to reduce the weight of the movable and stationary electrodes 24, 32, 42 and to enhance a mechanical strength against a torsional force imposed thereon. A ditch that reaches the top surface of the oxidized film 13 is formed surrounding the beam structure composed of the movable portion 20 and the pair of stationary portions 30, 40. A filed portion 60 formed outside the ditch is electrically insulated from the beam structure by the ditch. The beam structure is electrically shielded from outside by the field portion 60. A peripheral groove 17 that reaches the top surface of the oxidized film 13 is formed at the outermost periphery of the sensor chip 10.

As shown in FIG. 2, the bottom surface of the sensor chip 10 is mounted on a sensor package 81 via adhesive 80. The electrode pads 25a, 31a, 41a of the sensor chip 10 are electrically connected to a circuitry (not shown) contained in the package 81 by wire-bonding or the like.

The first variable capacitor CS1 formed by the first stationary electrodes 32 and the movable electrodes 24 and the second variable capacitor CS2 formed by the second stationary electrodes 42 and the movable electrodes 24 are used as capacitors for detecting acceleration. That is, when an acceleration force is imposed on the movable portion 20, the movable electrodes 24 are displaced in the direction X under the spring function of the beams 22, and thereby the capacitances of both capacitors CS1, CS2 change according to the displacement of the movable electrodes 24. The circuitry contained in the sensor package detects a difference between CS1 and CS2 (CS1−CS2) and outputs an electrical signal representing the acceleration imposed on the sensor chip 10.

Now, a manufacturing process of the sensor chip 10 will be described with reference to FIGS. 3A–3C. The cross-sectional views shown therein correspond to the cross-sectional view shown in FIG. 2. FIG. 3C shows a partly enlarged cross-sectional view of a dicing portion. Plural sensor chips 10 are formed on a first surface 1a (on the second silicon layer 12) of the SOI substrate 1 through known processes such as photolithography and dry or wet etching. The sensor chips 10 formed on the substrate, each having the beam structure 20, 30, 40, the field portion 60, the peripheral groove 17 and so on, are separated into individual sensor chips 10 by dicing.

More particularly, a conductor film of aluminum or the like is formed on the first surface 1a of the SOI substrate 1. The conductor film is patterned to form the electrode pads 25a, 31a, 41a under photolithography and etching processes. Then, a masking film (a plasma-SiN film or the like) for etching the opening 13a is formed on the second surface 1b of the SOI substrate 1. Then, a PIQ (polyimide) film is coated on the second surface 1b of the substrate 1, and the beam structure 20, 30, 40, the field portion 60 and the peripheral groove 17 are patterned by etching the PIQ film. Then, a resist film as a protective film is coated on the PIQ film, and the second surface 1b side is deep-etched by KOH aqueous solution or the like. In this deep-etching process, the oxidized film 13 acts as a stopper because an etching speed of the oxidized film 13 is slow compared with that of silicon.

Then, the oxidized film 13 and the plasma-SiN film which are exposed are removed by HF aqueous solution or the like, and the resist film protecting the first surface 1a is removed. Then, the sensor structure including the beam structure 20, 30, 40, the field portion 60, and the peripheral groove 17 is made by forming cavities in the second silicon layer 12 by dry-etching using the PIQ film as a mask. Finally, the PIQ film is removed by $O_2$-ashing or the like. Thus, the plural sensor chips 10, one of which is shown in FIG. 3A, are formed on the first surface 1a of the SOI substrate 1.

Figure 3B:
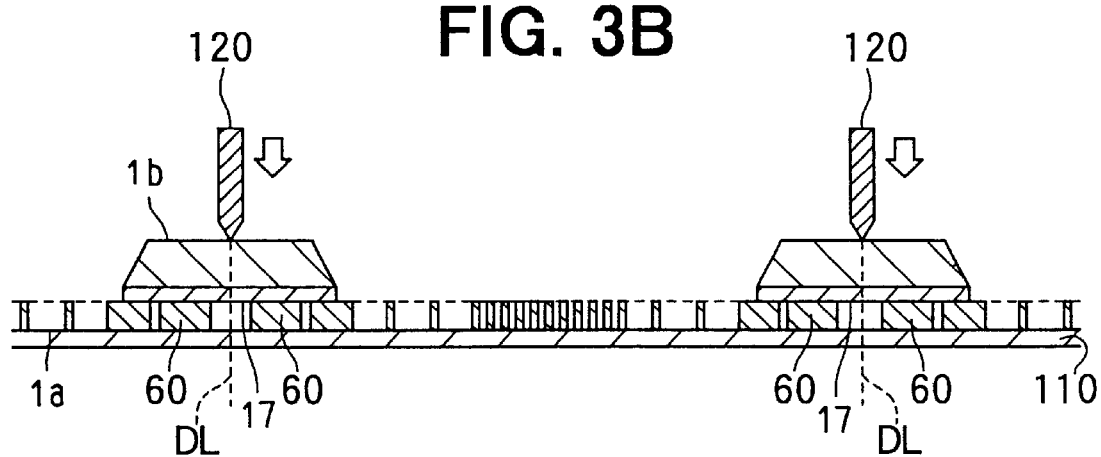
Figure 3C:
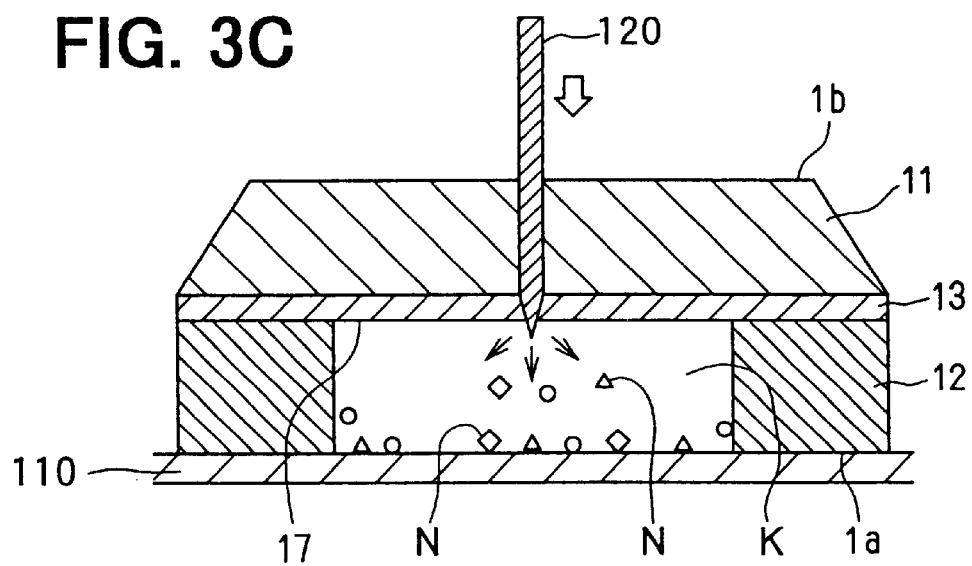

After the sensor chips 10 are formed on the first surface 1a of the SOI substrate 1, a protecting sheet 110 is pasted on the first surface 1a (the first surface 10a of the sensor chip), as shown in FIG. 3B. The protecting sheet is a resin dicing tape that is usually used in the dicing process. The plural sensor chips 10 are separated into individual pieces by dicing along dicing lines DL that run through the center of the peripheral groove 17. As shown in FIG. 3B, a dicing blade 120 is aligned with the dicing line on the second surface 1b, and the dicing proceeds from the second surface 1b toward the first surface 1a on which the protecting sheet 110 is pasted. After the sensor chips 10 are separated into individual pieces by dicing, the protecting sheet 110 is removed from the sensor chip 10. Thus, the manufacturing process of the sensor chip 10 is completed.

In the dicing process of the prototype sensor chip described above, the following problem has been found. FIG. 3C shows the dicing portion in an enlarged scale. A hollow space K is formed between the bottom surface of the peripheral groove 17 and the protecting sheet 110. As the dicing blade 120 cuts through the first silicon layer 11 and the oxidized film 13, swarfs N (particles produced by dicing) scatter in the hollow space K. Though some swarfs N adhere to the protecting sheet 110, some other swarfs N remain in the sensor chip 10 and adhere to the movable electrodes 24 or other portions. The swarfs N remained in the sensor chip 10 cause malfunction of the sensor chip 10.

(First Embodiment)

To eliminate the problem found in the dicing process of the prototype sample, a first embodiment has been devised. It is found out that the swarfs N do not remain in the sensor chip 10 if the hollow space K where the swarfs N scatter is eliminated. If the protecting sheet 110 pasted on the first surface 1a is bent along the peripheral groove 17, the hollow space K will be eliminated. However, it is difficult to bend the protecting sheet 110 along the peripheral groove 17, because the width of the peripheral groove 17 is too narrow in the prototype. Accordingly, the width of the peripheral groove is widened in the first embodiment.

Now, the first embodiment will be briefly described with reference to FIGS. 4–6C. Because the first embodiment is almost the same as the prototype described above, only the difference from the prototype will be described. The same reference numerals as those of the prototype denote the same components.

Figure 4:
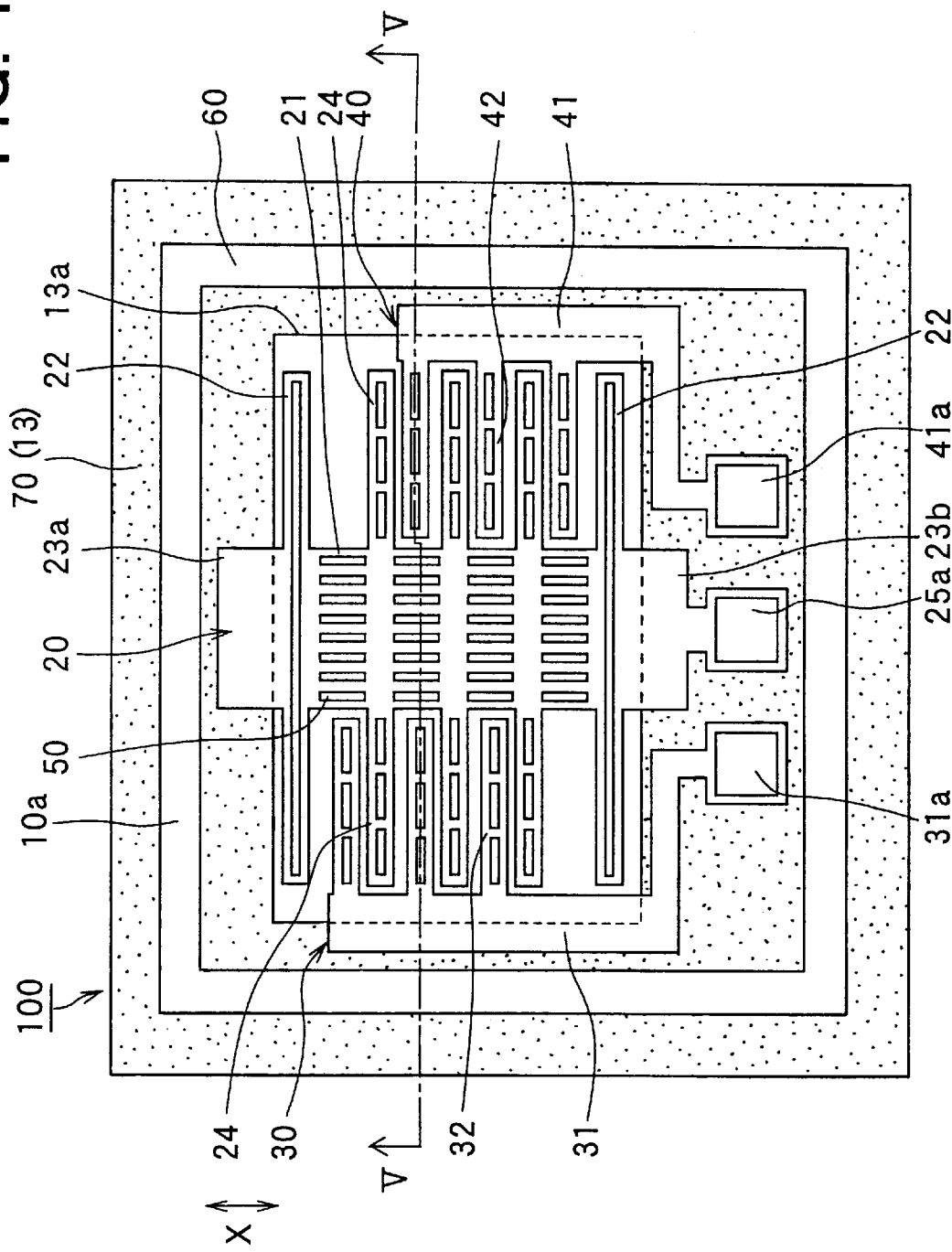
FIG. 4 is a plan view showing a semiconductor acceleration sensor chip as a first embodiment of the present invention.
Figure 6A:
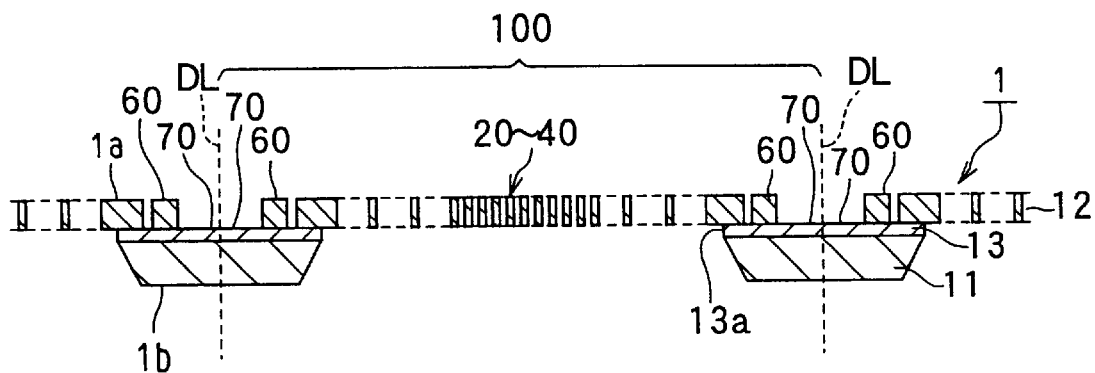
FIGS. 6A–6C are cross-sectional views showing a manufacturing process of the acceleration sensor chip shown in FIG. 4, FIG. 6C showing a partly enlarged cross-section.
Figure 6B:
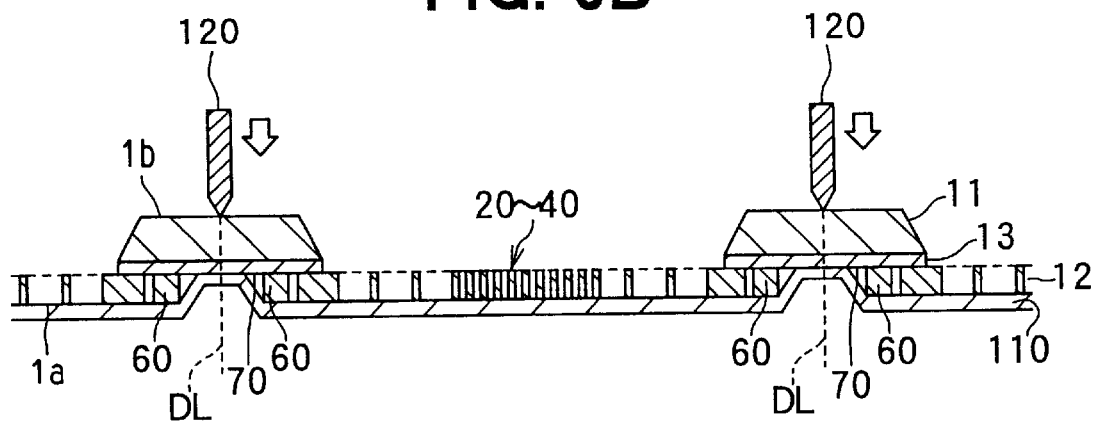
Figure 6C:
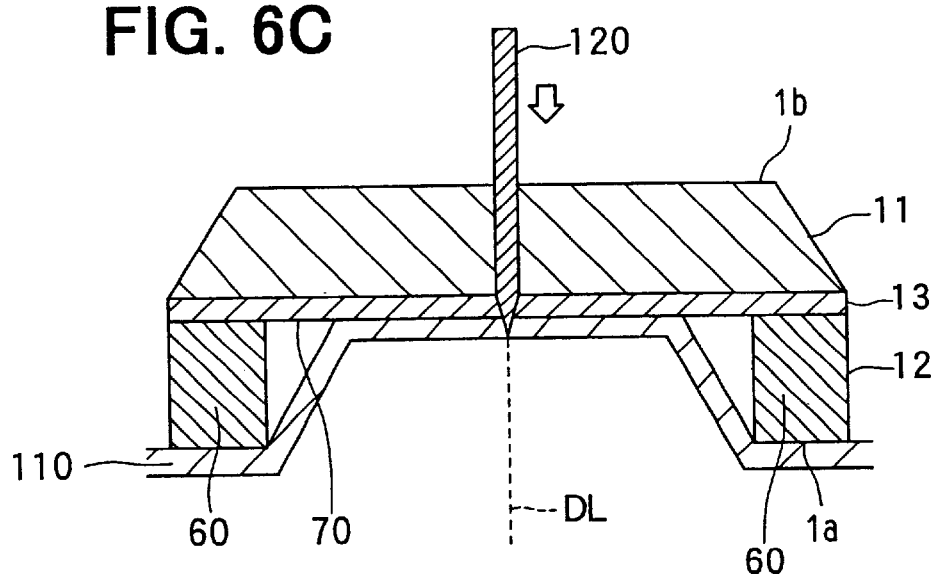

FIG. 4 shows a plan view of a sensor device 100 as the first embodiment of the present invention. The width of the peripheral groove 17 of the prototype is widened, and a reference number 70 denotes the widened peripheral groove. Since the surface of the oxidized film 13 is exposed to the bottom of the peripheral groove 70, the groove carries reference numbers 70(13) in FIG. 4. FIG. 5 shows a cross-sectional view of the sensor chip 100, taken along line V—V shown in FIG. 4. The peripheral groove 70 is widened, compared with that of the prototype. FIGS. 6A–6C show the manufacturing process of the sensor chip 100, which is similar to that of the prototype sensor chip 10, except that the peripheral groove 70 is widened.

Referring to FIG. 6C, the widened peripheral groove 70 will be described in detail. To paste the protecting sheet 110 along the bottom surface of the peripheral groove 70, eliminating the hollow space K otherwise formed between the bottom surface of the peripheral groove 70 and the protecting sheet 110, the width of the groove 70 has to be sufficiently wide compared with the thickness of the second silicon layer 12. It is found out that the width of the groove 70 has to be at least 5 times of the thickness of the second silicon layer 12, preferably, 10 to 13 times, or more. Since the thickness of the second silicon layer 12 is 15 $\mu$m, the width of the groove 70 has to be at least 75 $\mu$m, preferably 150 $\mu$m to 200 $\mu$m.

The dicing dusts (swarfs) problem has been overcome by making the peripheral groove 70 sufficiently wide so that the protecting sheet 110 can be pasted along the bottom surface of the groove 70.

(Second Embodiment)

A sensor chip 200 as a second embodiment of the present invention will be described with reference to FIGS. 7–9C. The second embodiment is similar to the first embodiment, except that the peripheral groove 70 of the first embodiment is replaced with a ditch 210 and a peripheral bank 211. The same components as those of the first embodiment carry the same reference numbers, and only the points of the second embodiment which are different from the first embodiment will be described below.

Figure 7:
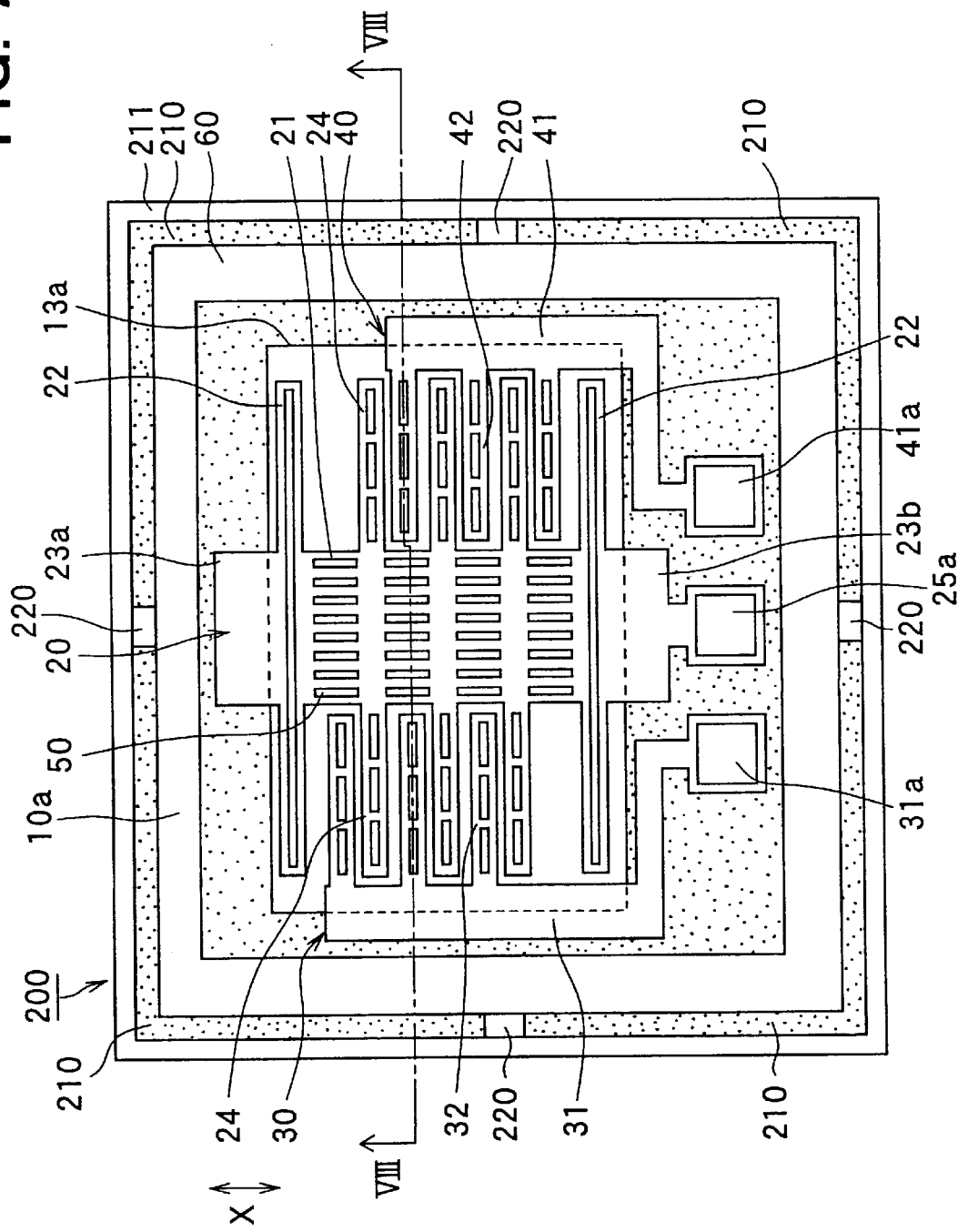
FIG. 7 is a plan view showing a semiconductor acceleration sensor chip as a second embodiment of the present invention.
Figure 8:
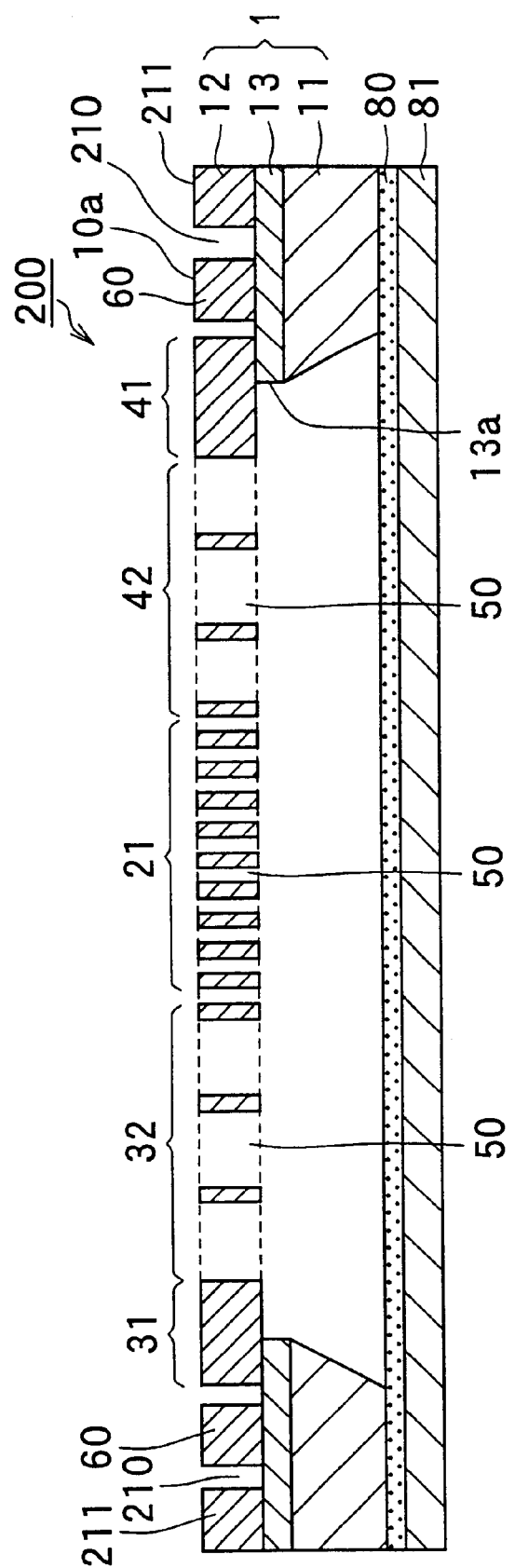
FIG. 8 is a cross-sectional view showing the acceleration sensor chip shown in FIG. 7, taken along line VIII—VIII in FIG. 7.

As shown in FIG. 7, a peripheral bank 211 surrounding a peripheral ditch 210 that is similar to the groove 70 in the first embodiment is additionally formed. Four electrical bridges 220 formed on the first surface 10a of the sensor chip 200 electrically connect each side of the peripheral bank 211 to each side of the field portion 60. Though at least one electrical bridge 220 is necessary, four bridges are provided in this embodiment. The electrical bridges 220 are formed by leaving a portion of the second silicon layer 12 un-etched.

Figure 9A:
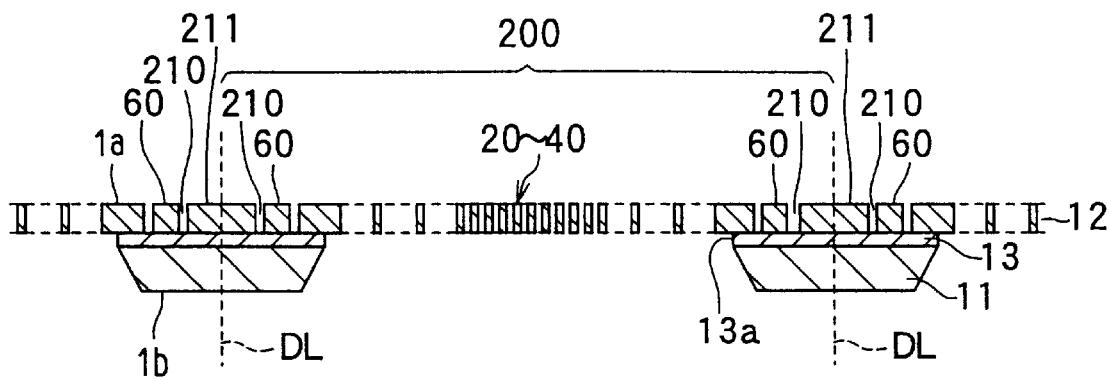
FIGS. 9A–9C are cross-sectional views showing a manufacturing process of the acceleration sensor chip shown in FIG. 7, FIG. 9C showing a partly enlarged cross-section.
Figure 9B:
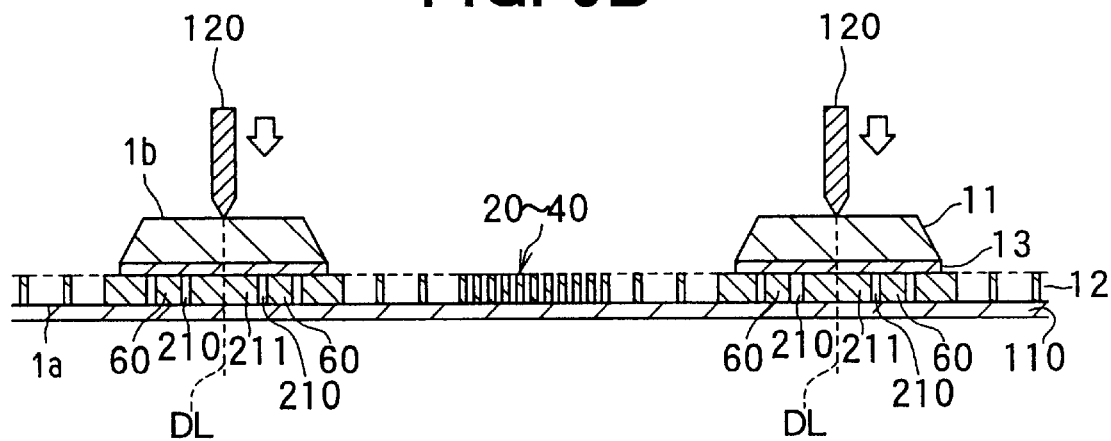
Figure 9C:
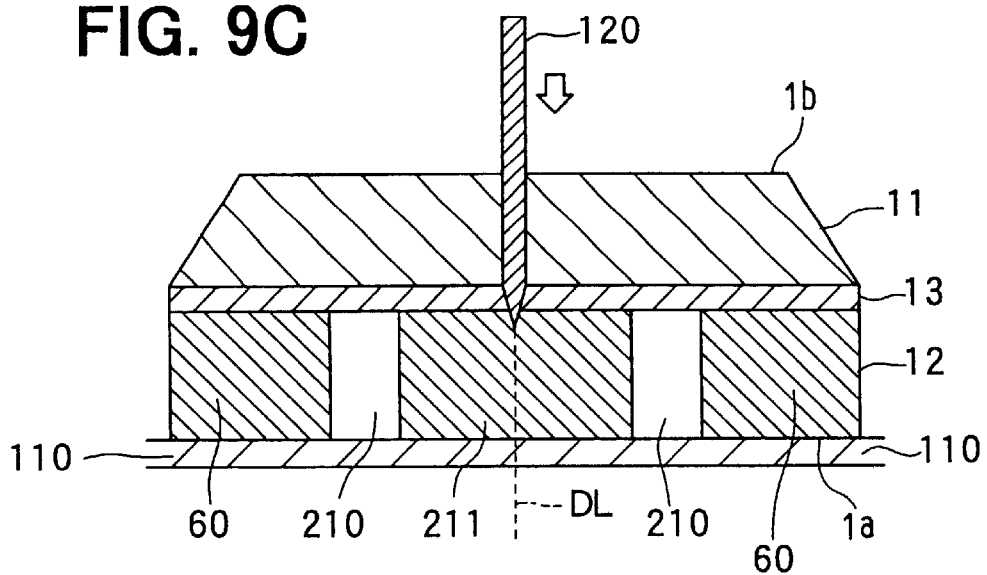

Referring to FIGS. 9A–9C which correspond to FIGS. 6A–6C of first embodiment, a manufacturing process of the sensor chip 200 will be briefly described. Components of the sensor chip 200 are formed on the first surface 1a of the SOI substrate 1 in the same manner as in the first embodiment. The electrical bridges 220 formed by leaving portions of the second silicon layer 12 un-etched may be replaced with separate wires connecting the field portion 60 to the peripheral bank 211.

After the plural sensor chips 200 are formed on the first surface 1a of the SOI substrate 1 as shown in FIG. 9A, the protecting sheet 110 is pasted on the first surface 1a of the SOI substrate 1 as shown in FIG. 9B. In the second embodiment, the dicing line DL is set through the center of the peripheral bank 211, not through the center of the peripheral ditch 210. The sensor chips 200 are separated into individual pieces by dicing along the dicing line DL.

The dicing portion is shown in FIG. 9C. in an enlarged scale. The dicing blade 120 enters the second surface 1b and comes out from the first surface 1a. Since the protecting sheet 110 is pasted on the first surface 1a, there is no hollow space in which the swarfs (dicing dusts) scatter in the dicing process. Therefore, the sensor chip 200 can be kept free from the swarfs, and thereby malfunction of the sensor chip 200 due to the swarfs can be avoided.

Though the field portion 60 and the peripheral bank 211 are separated by the peripheral ditch 210 in this embodiment, no parasitic capacitance is created between the field portion 60 and the bank 211 because both are electrically connected by the bridges 220.

Application of the present invention is not limited to the sensor chips for measuring acceleration, but the present invention may be applied to other semiconductor devices having structures similar to the sensor chips described above. For example, the present invention may be applied to dynamic sensors such as pressure sensors or angular velocity sensors, as long as plural chips are made on the first surface of a substrate and diced out into separate pieces from the second surface after a protecting sheet are pasted on the first surface.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a semiconductor chip having semiconductor elements, the method comprising:

forming a plurality of semiconductor chips and peripheral grooves for separating the semiconductor chips into individual pieces on a first surface of a semiconductor substrate, each peripheral groove surrounding an outer periphery of each semiconductor chip;

pasting a protecting sheet on the first surface of the semiconductor substrate so that the protecting sheet is bent along bottom walls of the peripheral grooves and the protecting sheet adheres to the bottom walls; and dicing the semiconductor substrate from a second surface of the semiconductor substrate along the peripheral grooves to separate the semiconductor chips into individual pieces.

2. A method of manufacturing a semiconductor dynamic sensor chip having movable electrodes responsive to dynamic force imposed thereon and stationary electrodes facing the movable electrodes, a capacitance formed between the movable electrodes and stationary electrodes being changed in response to the dynamic force, the method comprising:

forming a plurality of semiconductor dynamic sensor chips, peripheral ditches surrounding each sensor chip and peripheral banks further surrounding each ditch on a first surface of a semiconductor substrate;

electrically connecting the peripheral bank to an inner portion of each sensor chip to prevent formation of parasitic capacitance therebetween;

pasting a protecting sheet on the first surface of the semiconductor substrate; and dicing the semiconductor substrate from a second surface of the semiconductor substrate along the peripheral banks, thereby separating the plurality of sensor chips into individual pieces.

3. The method of manufacturing a semiconductor chip as in claim 1, wherein:

each semiconductor chip includes a beam structure having electrodes which are movable in response to a dynamic force imposed thereon.

4. The method of manufacturing a semiconductor chip as in claim 1, wherein:

a width of the peripheral groove is sufficiently wide compared with a thickness of the semiconductor substrate.

5. The method of manufacturing a semiconductor chip as in claim 4, wherein:

the width of the peripheral groove is at least five times the thickness of the semiconductor substrate.

6. The method of manufacturing a semiconductor chip as in claim 1, wherein:

the pasting of the protecting sheet on the first surface of the semiconductor substrate so that the protecting sheet is bent along bottom walls of the peripheral walls of the peripheral grooves and the protecting sheet adheres to the bottom walls prevents dicing dust from scattering into elements of the sensor chip.

* * * * *